United States Patent
Kamigaki

(10) Patent No.: US 9,679,699 B2
(45) Date of Patent: Jun. 13, 2017

(54) DIELECTRIC FILM, FILM CAPACITOR, AND ELECTRIC DEVICE

(71) Applicant: KYOCERA Corporation, Kyoto-shi, Kyoto (JP)

(72) Inventor: Kousei Kamigaki, Kyoto (JP)

(73) Assignee: KYOCERA CORPORATION, Kyoto-Shi, Kyoto (JP)

(*) Notice: Subject to any disclaimer, the term of this patent is extended or adjusted under 35 U.S.C. 154(b) by 0 days.

(21) Appl. No.: 14/906,341

(22) PCT Filed: Jul. 30, 2014

(86) PCT No.: PCT/JP2014/070087
§ 371 (c)(1),
(2) Date: Jan. 20, 2016

(87) PCT Pub. No.: WO2015/016268
PCT Pub. Date: Feb. 5, 2015

(65) Prior Publication Data
US 2016/0181017 A1    Jun. 23, 2016

(30) Foreign Application Priority Data

Jul. 30, 2013  (JP) .................................. 2013-157867

(51) Int. Cl.
*H01G 4/06*    (2006.01)
*C04B 35/00*   (2006.01)
(Continued)

(52) U.S. Cl.
CPC ........... *H01G 4/18* (2013.01); *C04B 35/4682* (2013.01); *C08K 3/00* (2013.01); *C08K 9/10* (2013.01);
(Continued)

(58) Field of Classification Search
CPC ................... H01G 4/33; H01G 4/1209; H05K 2201/10015
(Continued)

(56) References Cited

U.S. PATENT DOCUMENTS 4,469,747 A * 9/1984 Sasaki ...................... H01B 3/40
264/176.1
4,695,921 A * 9/1987 Robbins ................... H01G 2/06
361/308.2
(Continued)

FOREIGN PATENT DOCUMENTS

JP         09-129475 A    5/1997
JP       2000-294447 A   10/2000
(Continued)

OTHER PUBLICATIONS

International Search Report, PCT/JP2014/070087, Sep. 9, 2014, 2 pgs.
(Continued)

*Primary Examiner* — Sherman Ng
(74) *Attorney, Agent, or Firm* — Volpe and Koenig, P.C.

(57) ABSTRACT

There are provided a dielectric film, a film capacitor and an electric device capable of achieving an increase in relative permittivity without causing a decrease in breakdown field strength. A dielectric film includes an organic resin and ceramic particles contained in the organic resin. The ceramic particles each have a crystal lattice defined by three axes composed of axis a, axis b, and axis c, and including two or more crystalline phases of different axial ratios c/a. Owing to each crystal phase having different extents of dielectric polarization originating from the differences in shapes (sizes) of the crystal lattices, the ceramic particles each have (Continued)

regions with different permittivities, achieving an increase in relative permittivity without causing a decrease in breakdown field strength.

9 Claims, 6 Drawing Sheets

(51) Int. Cl.
| | | |
|---|---|---|
| H01G 4/18 | (2006.01) | |
| C08K 3/00 | (2006.01) | |
| C08L 101/00 | (2006.01) | |
| H01G 4/12 | (2006.01) | |
| H01G 4/20 | (2006.01) | |
| C08K 9/10 | (2006.01) | |
| H05K 1/18 | (2006.01) | |
| C04B 35/468 | (2006.01) | |
| H01G 4/33 | (2006.01) | |

(52) U.S. Cl.
CPC .......... *C08L 101/00* (2013.01); *H01G 4/1209* (2013.01); *H01G 4/1227* (2013.01); *H01G 4/206* (2013.01); *H05K 1/18* (2013.01); *H01G 4/33* (2013.01); *H05K 2201/10015* (2013.01)

(58) Field of Classification Search
USPC ......... 361/321.1, 321.4, 321.5; 501/137, 139
See application file for complete search history.

(56) References Cited

U.S. PATENT DOCUMENTS

| | | | | |
|---|---|---|---|---|
| 5,305,178 A | * | 4/1994 | Binder ................... | B05D 1/62 29/25.42 |
| 6,087,287 A | * | 7/2000 | Iguchi .................... | H01G 4/20 156/89.14 |
| 6,104,597 A | * | 8/2000 | Konushi ................. | H01G 4/38 338/204 |
| 2002/0016249 A1 | * | 2/2002 | Saito ..................... | C04B 35/468 501/139 |
| 2002/0040085 A1 | | 4/2002 | Venigalla et al. | |
| 2006/0116273 A1 | * | 6/2006 | Ito ..................... | C04B 35/62645 501/137 |
| 2007/0155613 A1 | * | 7/2007 | Ito ......................... | C04B 35/468 501/137 |
| 2007/0205389 A1 | | 9/2007 | Kurozumi et al. | |
| 2008/0266751 A1 | * | 10/2008 | Yamazaki ........... | C04B 35/4682 361/321.4 |
| 2010/0014214 A1 | * | 1/2010 | Yamazaki .............. | B32B 18/00 361/321.4 |
| 2010/0231138 A1 | | 9/2010 | Kumada et al. | |
| 2011/0222205 A1 | * | 9/2011 | Muraki ................ | C01G 23/006 361/321.5 |

FOREIGN PATENT DOCUMENTS

| | | |
|---|---|---|
| JP | 2005-306728 A | 11/2005 |
| JP | 2006-137647 A | 6/2006 |
| JP | 2006-225484 A | 8/2006 |
| JP | 2007-210811 A | 8/2007 |
| JP | 2010-178571 A | 8/2010 |

OTHER PUBLICATIONS

Japanese Office Action with English concise explanation, Japanese Patent Application No. 2015-529597, Feb. 21, 2017, 8 pgs.
Extended European Search Report, European Patent Application No. 14831637.5, Mar. 3, 2017, 9 pgs.
Chen, C.S., et al., "Microstructures of X7R type base-metal-electroded BaTiO3 capacitor materials prepared by duplex-structured process," Science Direct, Journal of the European Ceramic Society 25 (2005) Apr. 22, 2005, pp. 2743-2747.
Hoshina, T., et al., "Composite structure and size effect of barium titanate nanoparticles," American Institute of Physics, Applied Physics Letters 93, 192914 (2008), 3 pgs.

* cited by examiner

FIG.5
(a)
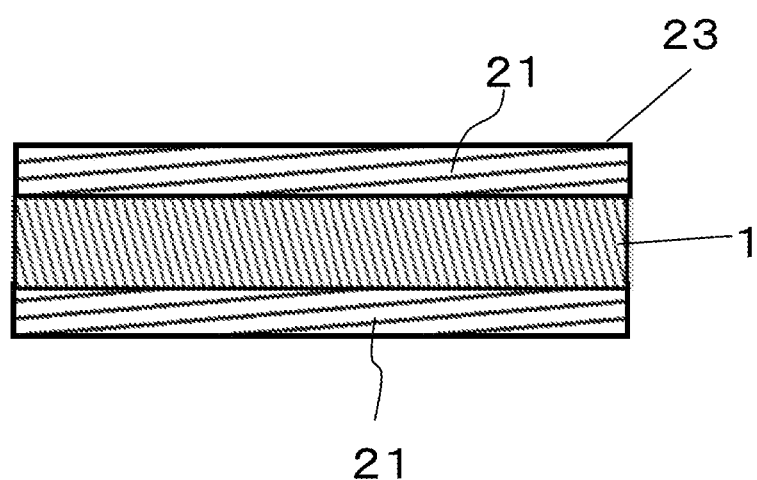
(b)
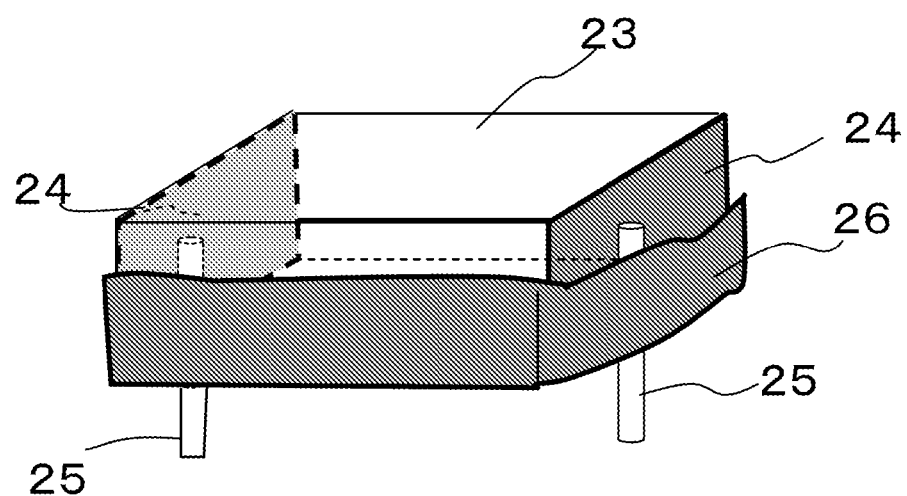

DIELECTRIC FILM, FILM CAPACITOR, AND ELECTRIC DEVICE

TECHNICAL FIELD

The present invention relates to a dielectric film, a film capacitor, and an electric device.

BACKGROUND ART

For example, a film capacitor includes a metallic membrane as an electrode which is formed on a surface of a dielectric film such as film form polypropylene resin by means of vapor deposition. With this construction, even if electrical short-circuiting occurs in an insulation defective area of the dielectric film, the metallic membrane located around the defective area is vaporized for release under energy of short-circuiting with consequent electrical isolation, thus affording the advantage of protecting the film capacitor from an electrical breakdown (for example, refer to Patent Literature 1).

Such a film capacitor, being noteworthy for its capability of preventing ignition and electric shock entailed by short-circuiting of an electric circuit, has recently been finding widespread applications including an application of film capacitors to a power supply circuit of LED (Light Emitting Diode) illumination, for example (for example, refer to Patent Literature 2).

However, on a substrate on which are mounted various electronic components, a film capacitor is still made of large size as compared with other electronic component such as a ceramic capacitor, and its large size constitutes an impediment to accomplishment of low-profile design and higher packaging density in the substrate. Therefore, studies have been carried out on development of a smaller film capacitor.

In this case, a film capacitor can be downsized by thinning of a film which is a dielectric, or by a reduction in the number of layers or convolutions of the film. However, to achieve this, improvements in relative permittivity and breakdown field strength in the film is necessary.

For example, in Patent Literature 3, there is proposed application of a dielectric film made of an organic resin with an epoxy group that contains ceramic fillers in a dispersed state to the film.

CITATION LIST

Patent Literature

Patent Literature 1: Japanese Unexamined Patent Publication JP-A 9-129475 (1997)
Patent Literature 2: Japanese Unexamined Patent Publication JP-A 2010-178571
Patent Literature 3: Japanese Unexamined Patent Publication JP-A 2006-225484

SUMMARY OF INVENTION

Technical Problem

However, in the dielectric film as above described, even when ceramic particles are contained at a relatively high volume ratio, concentration of electric field energy ($\in r \times E^2/2$) resulting from an applied electric field is less likely to occur in the ceramic particles of high relative permittivity, wherefore the level of relative permittivity is not significantly raised. On the other hand, there arises an increase in electric field intensity in the organic resin around the ceramic particles, thus causing a decrease of the breakdown field strength of the dielectric film as a whole.

The invention has been devised to solve the problem as mentioned supra, and accordingly an object of the invention is to provide a dielectric film which is capable of an increase in relative permittivity without a decrease in breakdown field strength, a film capacitor, and an electric device.

Solution to Problem

A dielectric film according to the invention comprises an organic resin and ceramic particles contained in the organic resin, the ceramic particles each having a crystal lattice defined by three axes composed of axis a, axis b, and axis c, and including two or more crystalline phases of different axial ratios c/a.

A film capacitor according to the invention comprises the aforestated dielectric film and an electrode layer disposed on the dielectric film.

An electric device according to the invention comprises an electric circuit including a conductor, and the aforestated film capacitor connected to the conductor.

Advantageous Effects of Invention

According to the invention, in a dielectric film, an increase in relative permittivity can be achieved without causing a decrease in breakdown field strength. Moreover, with respect to a film capacitor incorporating this dielectric film, it is possible to have high breakdown field strength, achieve small size, and obtain high electrostatic capacitance. In addition, with respect to an electric device incorporating this film capacitor, it is possible to obtain an electric device which achieves small size, has high packaging density, and exhibits excellent rectifying capability.

BRIEF DESCRIPTION OF DRAWINGS

FIG. 5(a) is a sectional view schematically showing the structure of a dielectric film having electrode layers on both sides thereof, and FIG. 5(b) is a perspective view showing the appearance of the film capacitor according to one embodiment of the invention.

DESCRIPTION OF EMBODIMENTS

Figure 1:
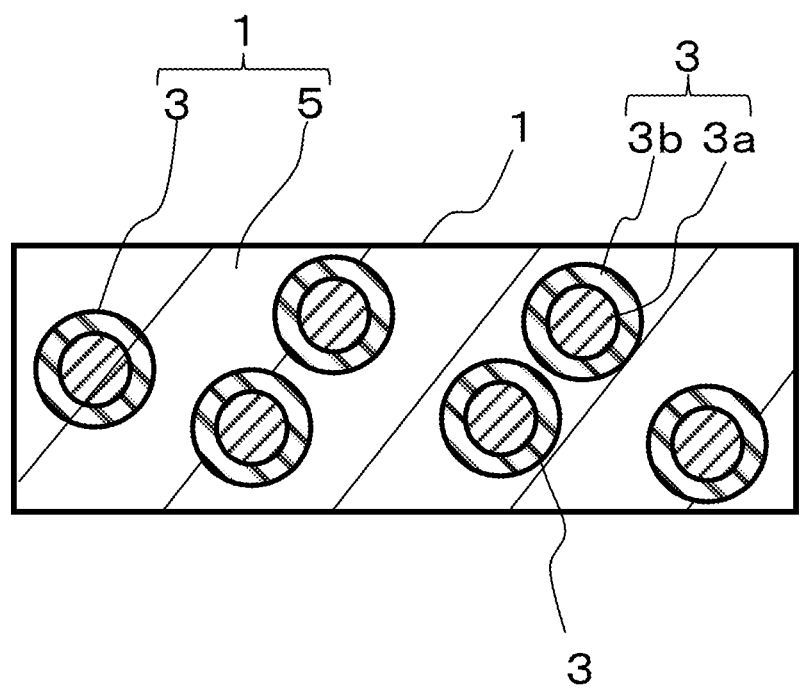
FIG. 1 is a schematic fragmentary sectional view showing a dielectric film according to one embodiment of the invention.
Figure 2:
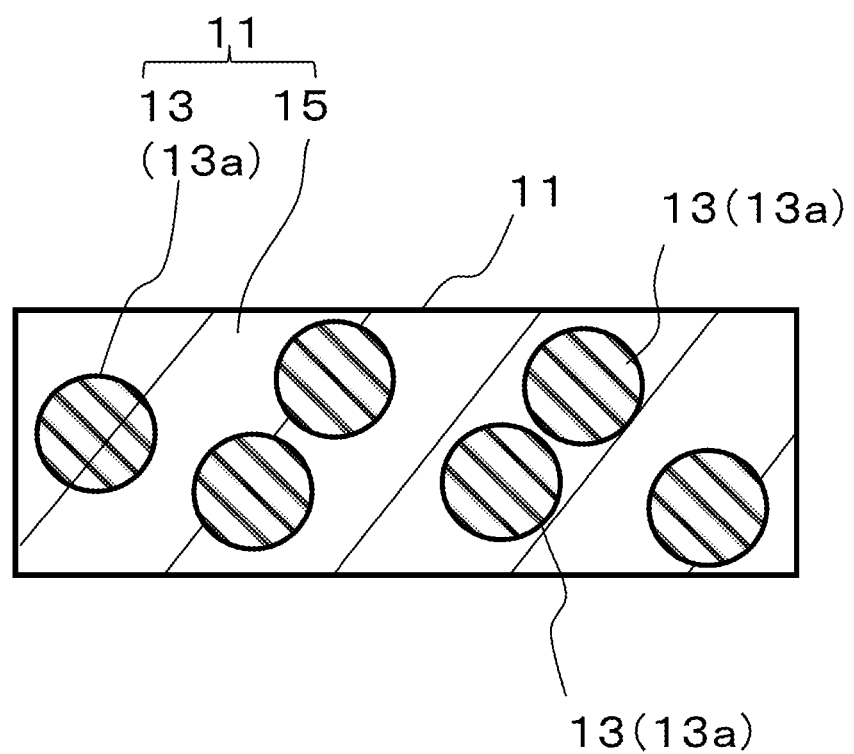
FIG. 2 is a schematic fragmentary sectional view showing a conventional dielectric film.
Figure 3:
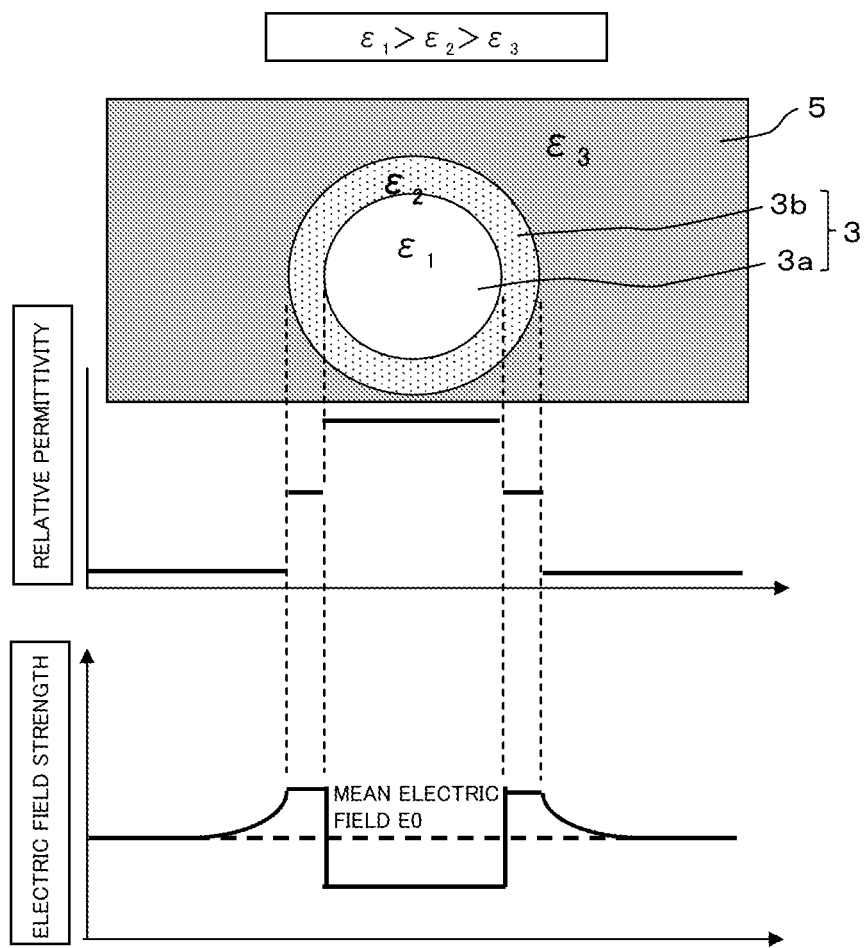
FIG. 3 is a diagrammatic representation of the dielectric film shown in FIG. 1 in which ceramic particles are present, illustrating variations in relative permittivity and electric field intensity at an interface between the ceramic particles and an organic resin.
Figure 4:
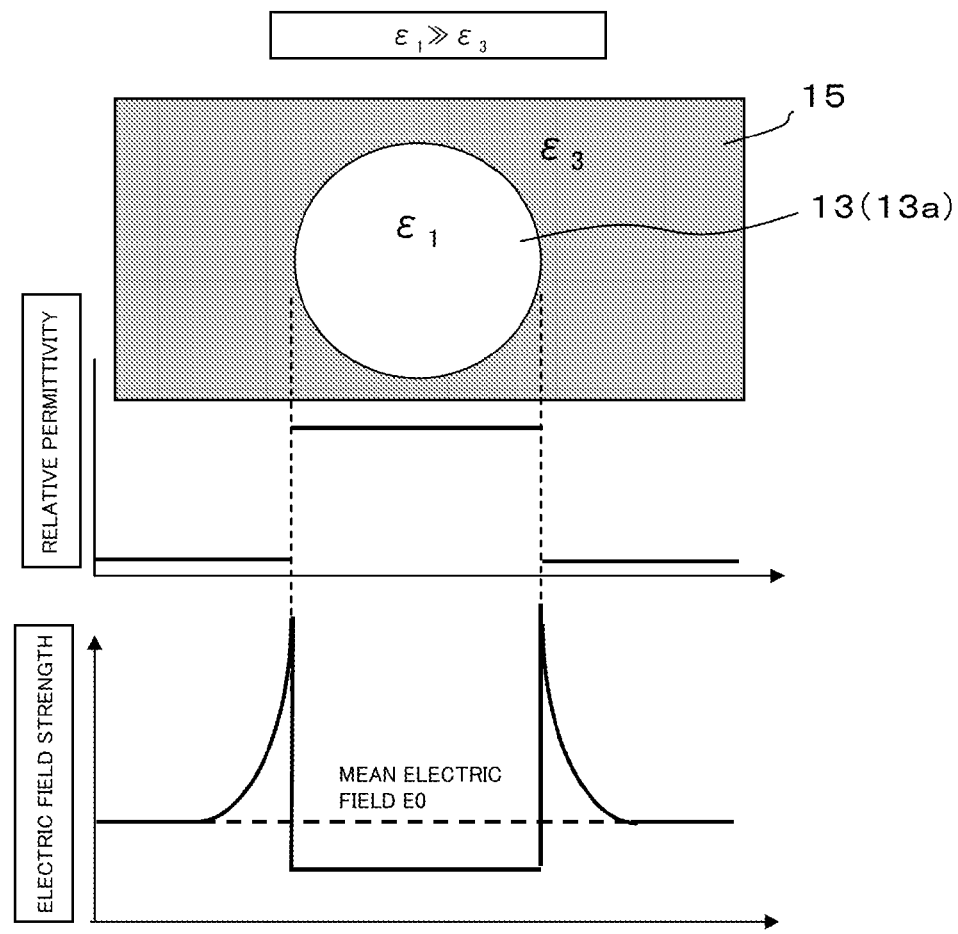
FIG. 4 is a diagrammatic representation of the conventional dielectric film shown in FIG. 2 in which ceramic particles are present, illustrating variations in relative permittivity and electric field intensity at an interface between the ceramic particles and an organic resin.

FIG. 1 is a schematic fragmentary sectional view showing a dielectric film according to one embodiment of the invention. FIG. 2 is a schematic fragmentary sectional view showing a conventional dielectric film. FIG. 3 is a diagrammatic representation of the dielectric film shown in FIG. 1 in which ceramic particles are present, illustrating variations in relative permittivity and electric field intensity at an interface between the ceramic particles and an organic resin. FIG. 4 is a diagrammatic representation of the conventional dielectric film shown in FIG. 2 in which ceramic particles are present, illustrating variations in relative permittivity and electric field intensity at an interface between the ceramic particles and an organic resin.

A dielectric film 1 of the present embodiment is made of a composite dielectric including ceramic particles 3 and an organic resin 5. The ceramic particles 3 constituting the dielectric film 1 of the present embodiment each have a crystal lattice defined by three axes composed of axis a, axis b, and axis c, and includes two or more crystalline phases of different axial ratios (c/a) (in FIGS. 1 and 3, there is shown a ceramic particle composed of two crystalline phases 3a and 3b.).

According to the dielectric film 1 of the present embodiment, by virtue of the inclusion of the ceramic particles 3 in the dielectric film 1, concentration of electric field energy resulting from an applied electric field tends to occur in the ceramic particles 3 having high relative permittivity, wherefore the level of relative permittivity of the dielectric film 1 can be raised.

For example, as shown in FIGS. 1 and 3, the ceramic particle 3 constituting the dielectric film 1 has two (or more) crystalline phases 3a and 3b of different axial ratios c/a. Thus, since the crystalline phases 3a and 3b differ from each other in the extent of dielectric polarization due to the difference in crystal lattice shape (size), it follows that the ceramic particle 3 has regions of different permittivities.

According to the dielectric film 1, the individual regions thereof, namely the inner part of the ceramic particle 3 (represented by 3a in FIG. 3), the part of the ceramic particle 3 located near the surface thereof (represented by 3b in FIG. 3), and the organic resin 5 have phases of different permittivities, wherefore a local increase in electric field intensity in between the ceramic particle 3 and the organic resin 5 can be suppressed. This makes it possible to maintain high breakdown field strength in the dielectric film 1, and thereby achieve an increase in relative permittivity without causing a decrease in breakdown field strength.

That is, in the dielectric film 1 of the present embodiment, since permittivity variations in between the ceramic particle 3 and the organic resin 5 are small, it is possible to suppress a local increase in electric field intensity ascribable to the permittivity variations in between the ceramic particle 3 and the organic resin 5. Thus, the breakdown field strength of the dielectric film 1 can be increased to a level close to the value of breakdown field strength inherent in the organic resin 5.

By way of contrast, a conventional dielectric film 11 containing a ceramic particle 13 composed of a single crystalline phase 13a as shown in FIGS. 2 and 4 is susceptible to abrupt permittivity variations in between the ceramic particle 13 and an organic resin 15. In this case, a local increase in electric field intensity tends to occur due to the permittivity variations in between the ceramic particle 13 and the organic resin 15, thus causing a decrease in breakdown field strength in the dielectric film 11.

The presence of the crystalline phases 3a and 3b of different axial ratios c/a in the ceramic particle 3 is determined on the basis of, for example, whether at least two of diffraction peaks corresponding to a plane index (400), a plane index (004), and a plane index (040), respectively, stand apart from each other, or the diffraction peaks corresponding to these plane indices (400), (004), and (040), respectively, stand in overlapping relation to one another at an angle of 2θ, in an X-ray diffraction pattern. By definition, the language "axial ratios c/a of crystal lattices are different" means that values of c/a have a difference of 0.002 (2/1000) or more. The axial ratios c/a of the ceramic particle 3 are determined by X-ray diffraction method.

Examples of the ceramic particle 3 in which the presence of the crystalline phases 3a and 3b can be recognized more clearly by the X-ray diffraction method, include a ceramic particle including only two crystalline phases of different axial ratios c/a.

Although the ceramic particle 3 should preferably include a large number of crystalline phases of different axial ratios c/a from the standpoint of minimizing abrupt permittivity variations in between the ceramic particle 3 and the organic resin 5, in the case where the ceramic particle 3 includes a large number of crystalline phases of different axial ratios c/a, the proportion of crystalline phases of high permittivity may be reduced. It is therefore preferable that only two crystalline phases 3a and 3b of different axial ratios c/a are present in the ceramic particle 3.

The ceramic particle 3 in a condition of including two crystalline phases of different axial ratios c/a refers to a ceramic particle including crystalline phases 3a and 3b having basically the same crystalline structure, in which the diffraction peaks based on the crystalline phases 3a and 3b, respectively, can be separated in an X-ray diffraction pattern as can be seen from the diffraction peaks corresponding to the plane indices (400), (004), and (040), respectively. That is, crystalline phases having different basic crystalline structure are excluded.

In the case where the ceramic particle 3 includes only two crystalline phases 3a and 3b of different axial ratios c/a, between the ceramic particle 3 and the organic resin 5, the ceramic particle 3 has two different permittivities, whereas the organic resin 5 has a single permittivity. This helps facilitate formation of a region where there is a gradual permittivity change from the ceramic particle 3 to the organic resin 5. Thus, in the dielectric film 1, it is possible to reduce the number of local areas subjected to an increase in electric field intensity, and thereby attain even higher permittivity while maintaining high breakdown field strength.

Examples of the ceramic particle 3 given above include a ceramic particle in which two types of crystalline phases constituting the ceramic particle 3 are arranged to define a core-shell structure as shown in FIG. 3. As used herein, the term "core-shell structure" refers to a structure composed of a core portion and a shell portion positioned around the core portion. The core portion is constituted by one of the two crystalline phases, and the shell portion is constituted by the other one of the two crystalline phases.

In the case where the two types of crystalline phases constituting the ceramic particle 3 are arranged to define a core-shell structure, a surface area (shell portion: 3b) of the ceramic particle 3 lies between a center area (core portion: 3a) of the ceramic particle 3 and the organic resin 5, and, the surface area (shell portion: 3b) of the ceramic particle 3 acts as a region having intermediate permittivity in between the center area (core portion: 3a) of the ceramic particle 3 and the organic resin 5. This makes it possible to form a ceramic particle 3 whose permittivity gradually changes from its center area (core portion: 3a) to the organic resin 5. Thus, abrupt field intensity variations at the interface between the ceramic particle 3 and the organic resin 5 can be minimized.

As a consequence, there is obtained a dielectric film 1 which is high in permittivity, in breakdown field strength, and in insulation reliability.

Moreover, in the case where the two types of crystalline phases constituting the ceramic particle 3 are arranged to define a core-shell structure, as shown in FIG. 3, it is preferable that the crystalline phase of smaller axial ratio c/a is located on an outside of the crystalline phase of larger axial ratio c/a. In other words, it is preferable that the crystalline phase constituting the shell portion is smaller in axial ratio c/a than the crystalline phase constituting the core portion.

A perovskite-structured ceramic material is preferably used for the ceramic particle 3 having such a core-shell structure. In the ceramic particle 3 of perovskite structure, for example, the axial ratio c/a may be varied according to changes in composition or differences in the degree to which constituent components go into solid solution, and also even higher permittivity can be attained with ease.

Examples of the perovskite-structured ceramic material include barium titanate ceramics.

The barium titanate ceramics is not limited to a composite oxide having a composition with a stoichiometric proportion which is expressed in chemical formula as $BaTiO_3$, but may be of a compound in which a compositional ratio of Ba to Ti and an oxygen content are varied to a limited extent that would allow the perovskite structure to be maintained, or a compound in which Ca substitutes for a Ba site so that Ca stays in solid solution with substantially the entire ceramic particle 3.

Moreover, a compound containing a solid solution of a component other than Ba, Ca, and Ti may be employed. In this case, examples of components other than Ba, Ca, and Ti include Mg, Sr, Zr, and Sn. It is preferable that, as contrasted to the core portion 3a, a part of the ceramic particle 3 located near the surface thereof (the region extending radially inwardly from the surface of the ceramic particle 3 by a distance equal to or less than one-third of the particle diameter) contains only one of the above-mentioned elements in a higher concentration. Moreover, it is preferable that the core portion 3a is composed of $BaTiO_3$, and the shell portion 3b contains Mg from the standpoint of increasing the product of permittivity (s) and dielectric breakdown voltage (E): $\in \times E^2$. In other words, it is preferable that the ceramic particle 3 contains magnesium, and the shell portion is higher in magnesium content concentration than the core portion. In the ceramic particle 3 in a condition of having a core-shell structure, given that the concentration of a specific component (for example, one of Mg, Sr, Zr, and Sn) contained in a region close to the surficial layer is 1, then the other region containing the above component in a concentration equal to or less than one-tenth of the concentration of 1 is determined to be the core portion. In this case, it is preferable that the ceramic particle 3 including the shell portion 3b has neither a rare earth element content nor a manganese content. If the ceramic particle 3 contains an element other than Mg, Sr, Zr, and Sn (for example, a rare earth element and manganese), a plurality of concentration gradients will be formed in the ceramic particle 3, wherefore a distinction between the core portion and the shell portion cannot be made with ease. This makes it difficult to form the dielectric film 1 which exhibits permittivity variations as shown in FIG. 3.

In the dielectric film 1 of the present embodiment, the volume ratio of the ceramic particles 3 contained therein falls in the range of 2 to 30% by volume, or preferably falls in the range of 3 to 20% by volume, or more preferably falls in the range of 10 to 15% by volume.

The average particle size of the ceramic particles 3 preferably falls in the range of 50 to 500 nm or the range of 50 to 300 nm, or particularly preferably falls in the range of 50 to 90 nm in the interest of formation of the crystalline phases 3a and 3b of different axial ratios c/a and attainment of even higher permittivity.

The volume ratio of the ceramic particles 3 constituting the dielectric film 1 is determined on the basis of the proportions of, respectively, the ceramic particles 3 and the organic resin 5 found in rectangular segments of a photograph of the section of the dielectric film.

The relative permittivity ($\in$) of the dielectric film 1 is derived from a sample constructed by forming an electrode layer having a predetermined area on each side of the dielectric film 1 cut from a film capacitor.

In evaluating the characteristics of the dielectric film, capacitance measurement is conducted with use of LCR meter, and, relative permittivity is determined by calculation on the basis of the measured capacitance, the effective area of the electrode layers (the area of the electrode layers disposed in overlapping relation on both sides of the dielectric film), and the thickness of the dielectric film.

As for the breakdown field strength (E) of the dielectric film 1, in a sample on which capacitance measurement has already been made, a voltage is placed between the electrodes of the dielectric film 1 at a commercial frequency of 60 Hz and at a pressure rising rate of 100 V per second, and, a voltage level at the instant at which the value of leakage current exceeds 1.0 mA is measured. On the basis of the measured voltage, the breakdown field strength is determined.

The thickness of the dielectric film 1 constituting the film capacitor of the present embodiment is preferably less than or equal to 10 µm, or particularly less than or equal to 5 µm from the standpoint of affording higher capacity on one hand, but is preferably greater than or equal to 1 µm from the standpoint of securing the breakdown field strength (E) of the dielectric film 1 for stabilization, on the other hand.

FIG. 5(a) is a sectional view schematically showing the structure of a dielectric film having electrode layers on both sides thereof, and FIG. 5(b) is a perspective view showing the appearance of the film capacitor according to one embodiment of the invention.

The film capacitor of the present embodiment, which is equipped with the dielectric film 1 thus far described, comprises a main body 23 including, as a basic structure, the dielectric film 1 having electrode layers 21 on both sides thereof. Thus, there is obtained the film capacitor capable of an increase in relative permittivity without a decrease in breakdown field strength.

The main body 23 may be applied not only to a multilayer film capacitor in which rectangular dielectric films 1 and electrode layer 21 are alternately stacked, but also to a wound type film capacitor in which elongated dielectric films 1 and electrode layer 21 are wound. Although such film capacitors may be designed to have a lead wire 25 acting as a terminal which is attached to an external electrode 24, with consideration given to miniaturization of the film capacitor, the lead wire 25 should preferably not be provided. Moreover, part of the main body 2, the external electrode 24, and the lead wire 25 may be covered with an exterior member 26 in the interest of insulation capability and environmental resistance.

Figure 6:
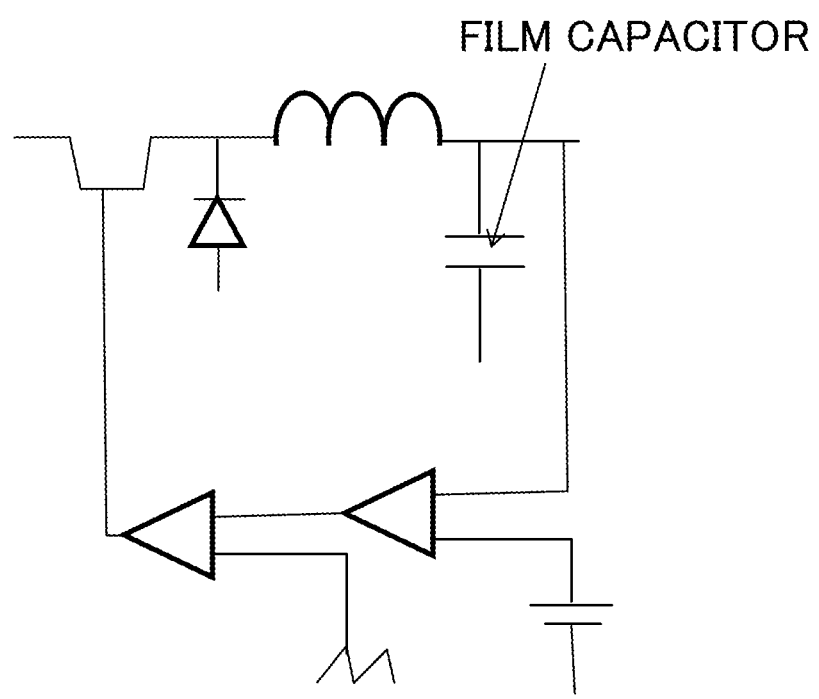
FIG. 6 is a view showing an example of an electric circuit incorporating the film capacitor according to the invention.

By connecting the film capacitor thus constructed to a conductor disposed in an electric circuit, it is possible to form an electric circuit having excellent rectifying capability, and thus provide a compact electric device having high packaging density. While, in FIG. 6, there is shown an example of an electric device incorporating the film capacitor pursuant to the invention in which an electric circuit aimed at decoupling is used as basic circuitry (the position of the film capacitor is indicated by an arrow in FIG. 6), the application of the film capacitor of the present embodiment is not so limited, and the film capacitor may thus be used for, in addition to an electric circuit aimed at decoupling, those aimed at noise removal, coupling, voltage smoothing, DC-AC conversion, and other purposes.

The dielectric film of the present embodiment can be obtained by the following manufacturing method, for example. First, an organic resin used as a base material for the dielectric film 1 is prepared.

Examples of the organic resin include polyethylene terephthalate (PET), polypropylene (PP), polyphenylene sulfide (PPS), polyethylene naphthalate (PEN), cycloolefin polymer (COP), polyether sulfone (PES), polyarylate (PAR), polyphenylene ether (PPE), and polyetherimide (PEI).

The relative permittivities ($\in$) of such organic resins are, for example, 3.3 for polyethylene terephthalate (PET), 2.3 for polypropylene (PP), 3.0 for polyphenylene sulfide (PPS), 2.2 to 3.0 for cycloolefin polymer (COP), 3.4 to 3.7 for polyether sulfone (PES), 3.1 to 3.4 for polyarylate (PAR), 2.5 to 2.7 for polyphenylene ether (PPE), and 3.1 to 3.3 for polyetherimide (PEI), at room temperature (about 25° C.)

Moreover, the breakdown field strengths (E) of such organic resins are, for example, 310 (V/μm) for polyethylene terephthalate (PET), 380 (V/μm) for polypropylene (PP), 210 (V/μm) for polyphenylene sulfide (PPS), 370 to 510 (V/μm) for cycloolefin polymer (COP), 280 (V/μm) for polyether sulfone (PES), 300 (V/μm) for polyarylate (PAR), 420 (V/μm) for polyphenylene ether (PPE), and 210 (V/μm) for polyetherimide (PEI), under application of ac voltage (at a frequency of 60 Hz) at room temperature (about 25° C.)

Perovskite-structured ceramic particles are suitable for use as the ceramic particles 3, and, for example, the use of barium titanate ceramics is desirable. In this case, the ceramic particles 3 may be subjected to surface treatment such as silane coupling treatment or titanate coupling treatment to enhance compatibility between the ceramic particle 3 and the organic resin 5.

Barium titanate ceramics including two or more crystalline phases of different axial ratios c/a can be obtained by adhering a plurality of elements other than Ba, Ca, and Ti, which can stay in solid solution with barium titanate, for example, MgO and so forth, to part of the surface of barium titanate powder, and then heating the resultant to cause them to go into solid solution with part of the barium titanate powder in the vicinity of the surface thereof.

To obtain barium titanate ceramics including two crystalline phases of different axial ratios c/a, there is prepared only one type of element which becomes a solid solution.

The ceramic particle 3 including two types of crystalline phases arranged to define a core-shell structure can be obtained by adhering an element which becomes a solid solution to substantially the entire surface of barium titanate powder, and then heating the resultant. In this case, the use of only one type of element which becomes a solid solution makes it possible to obtain the ceramic particle 3 in which two crystalline phases of different axial ratios c/a are arranged to define a core-shell structure and the crystalline phase of smaller axial ratio c/a is located on an outside of the crystalline phase of larger axial ratio c/a.

For example, the dielectric film 1 can be obtained by forming a membrane of the organic resin 5 containing the ceramic particles 3 on the surface of a PET-made film adopted as a base material.

Examples of a solvent for use in membrane formation include methanol, isopropanol, n-butanol, ethylene glycol, ethylene glycol monopropyl ether, methyl ethyl ketone, methyl isobutyl ketone, xylene, propylene glycol monomethyl ether, propylene glycol monomethyl ether acetate, dimethyl acetamide, cyclohexane, and an organic solvent containing a mixture of two or more substances selected from among those given above.

Next, the electrode layer 21 is formed on the surface of the dielectric film 1 by vapor deposition of a metal component such as Al (aluminum), and subsequently the dielectric film 1 having the electrode layer 21 is wound to constitute the main body 23 of the film capacitor.

Next, the external electrode 24 is formed on the end face of the main body 23 on which the electrode layer 21 is left exposed. For example, metal thermal spraying, sputtering, and plating are suitable for use in the formation of the external electrode 24. Moreover, at this time, the lead wire 25 may be formed on the external electrode 24. Then, the exterior resin 26 is formed on the surface of the main body 23 formed with the external electrode 24 (including the lead wire 15), whereupon the film capacitor of the present embodiment is obtained.

EXAMPLES

A dielectric film was produced with use of specifically selected materials. To begin with, ceramic particles of composite oxides as presented in Table 1 were prepared as the ceramic particles. The prepared ceramic particle comprises a dielectric material predominantly composed of barium titanate acting as a core, and Mg, Sr, Zr, and Sn staying in solid solution as oxides with substantially the entire surface of the core. The relative permittivity of the ceramic particles was rated as ranging from 1500 to 2500 in terms of relative permittivity of porcelain.

Polycycloolefin polymer (molecular weight: Mw=20000, relative permittivity of 2.2) was prepared as the organic resin. The ceramic particles were treated with a silane coupling agent to enhance compatibility with the organic resin.

Next, the ceramic particles were dispersed in cycloolefin polymer to prepare a slurry. At this time, cyclohexane was added as a diluent.

After that, the slurry was applied onto a polyethylene terephthalate (PET) film by means of a coater to form a sheet-like body.

Next, an Al-made electrode layer was formed in an average thickness of 75 nm on each side of the dielectric film by means of vacuum deposition.

Next, the dielectric film so obtained was subjected to the following evaluations.

As for dielectric breakdown voltage, a voltage were applied between the electrode layers of the dielectric film at a commercial frequency of 60 Hz and at a voltage rising rate of 10 V per second, and, a voltage level at the instant at which the value of leakage current exceeded 1.0 mA was measured. On the basis of the measured voltage, dielectric breakdown voltage was determined.

The measurement of relative permittivity and dielectric loss tangent was conducted with use of an LCR meter. More specifically, following the checking of the presence or absence of short-circuiting between the electrode layers of the produced dielectric film, the electrostatic capacitance and the dielectric loss of the dielectric film were measured by the LCR meter in conditions of a frequency of 1 KHz and an input signal level of 1.0 Vrms. After that, relative permittivity was determined by calculation on the basis of the electrostatic capacitance, the effective area of the electrode layers (the area of the electrode layers disposed in overlapping relation on both sides of the dielectric film), and the thickness of the dielectric film.

Moreover, electrostatic energy density ($\in \times E^2$) was determined on the basis of the measured permittivity ($\in$) and dielectric breakdown voltage (E).

In judging whether the ceramic particle includes two or more crystalline phases of different axial ratios c/a, the ceramic particle which has been extracted from the dielectric film dissolved in a solvent was subjected to X-ray diffraction analysis, and identification of crystalline phases was conducted (the plane index (400) was selected), and whereafter a lattice constant in each crystalline phase was obtained. The judgment was made on the basis of the lattice constants.

Moreover, the volume ratio of the ceramic particles contained in the dielectric film was determined by observing a photograph of the section of a sample, which was obtained by burying the dielectric film in a resin and then grinding the resin body to leave its section exposed, taken by a scanning electron microscope (SEM). The measured volume ratio coincided with the volume ratio found at the time of preparation of the dielectric film including the ceramic particles.

Moreover, the same evaluations were performed on other dielectric film samples employing ceramic particles of different types, namely ceramic particles of a type which includes a crystalline phase which differs in c/a from the core of the particle formed on part of the particle surface with the addition of an element which becomes a solid solution (Mg) in an amount equal to about one-half of the addition amount set for the sample presented in Table 1, and ceramic particles of a type which includes two or more crystalline phases of different axial ratios c/a obtained by adhering two elements (MgO and $Y_2O_3$) to part of the surface of barium titanate powder (the volume fraction of the ceramic particles is 10%).

TABLE 1

| | Ceramic particle | | | | | | | |
|---|---|---|---|---|---|---|---|---|
| | Average | | | Core | | | Shell | |
| Sample No. | Volume fraction % | particle size nm | Composition | Mean particle diameter nm | c/a | Composition | Me | Shell thickness nm | c/a |
| 1 | 10 | 100 | $BaTiO_3$ | 100 | 1.010 | (Ba, Ti, Me, O) compound | Mg | 0 | — |
| 2 | 5 | 100 | $BaTiO_3$ | 80 | 1.008 | (Ba, Ti, Me, O) compound | Mg | 10 | 1.000 |
| 3 | 10 | 100 | $BaTiO_3$ | 80 | 1.008 | (Ba, Ti, Me, O) compound | Mg | 10 | 1.000 |
| 4 | 15 | 100 | $BaTiO_3$ | 80 | 1.008 | (Ba, Ti, Me, O) compound | Mg | 10 | 1.000 |
| 5 | 10 | 70 | $BaTiO_3$ | 56 | 1.006 | (Ba, Ti, Me, O) compound | Mg | 7 | 1.000 |
| 6 | 10 | 200 | $BaTiO_3$ | 180 | 1.012 | (Ba, Ti, Me, O) compound | Mg | 10 | 1.000 |
| 7 | 10 | 300 | $BaTiO_3$ | 270 | 1.012 | (Ba, Ti, Me, O) compound | Mg | 15 | 1.000 |
| 8 | 10 | 100 | $BaTiO_3$ | 70 | 1.008 | (Ba, Ti, Me, O) compound | Sr | 15 | 1.000 |
| 9 | 10 | 100 | $BaTiO_3$ | 70 | 1.007 | (Ba, Ti, Me, O) compound | Zr | 15 | 1.000 |
| 10 | 10 | 100 | $BaTiO_3$ | 80 | 1.007 | (Ba, Ti, Me, O) compound | Sn | 10 | 1.000 |
| 11 | 10 | 100 | $(Ba_{0.98}Ca_{0.02})TiO_3$ | 60 | 1.010 | (Ba, Ca, Ti, Me, O) compound | Sr | 20 | 1.000 |
| 12 | 10 | 100 | $(Ba_{0.98}Ca_{0.02})TiO_3$ | 60 | 1.010 | (Ba, Ca, Ti, Me, O) compound | Zr | 20 | 1.000 |
| 13 | 10 | 100 | $(Ba_{0.98}Ca_{0.02})TiO_3$ | 70 | 1.010 | (Ba, Ca, Ti, Me, O) compound | Sn | 15 | 1.000 |

| | Dielectric film | | | | |
|---|---|---|---|---|---|
| Sample No. | Film thickness um | Permittivity ($\epsilon$) 1 kHz, RT | Dielectric loss 1 kHz, RT % | Dielectric breakdown voltage (E) 60 Hz, RT V | Electrostatic energy density $\epsilon \times E^2$ |
| 1 | 4.0 | 3.3 | 0.9 | 860 | 2,440,680 |
| 2 | 4.0 | 3 | 0.25 | 1640 | 8,068,800 |
| 3 | 4.0 | 3.3 | 0.3 | 1580 | 8,238,120 |
| 4 | 4.0 | 3.8 | 0.35 | 1440 | 7,879,680 |
| 5 | 4.0 | 3.3 | 0.2 | 1660 | 9,093,480 |
| 6 | 4.0 | 3.5 | 0.35 | 1560 | 8,517,600 |
| 7 | 4.0 | 3.5 | 0.2 | 1520 | 8,086,400 |
| 8 | 4.0 | 3.3 | 0.3 | 1500 | 7,425,000 |
| 9 | 4.0 | 3.3 | 0.35 | 1520 | 7,624,320 |
| 10 | 4.0 | 3.2 | 0.2 | 1450 | 6,728,000 |

TABLE 1-continued

|    |     |     |     |      |           |
|----|-----|-----|-----|------|-----------|
| 11 | 4.0 | 3.1 | 0.4 | 1510 | 7,068,310 |
| 12 | 4.0 | 3.1 | 0.5 | 1550 | 7,447,750 |
| 13 | 4.0 | 3   | 0.4 | 1460 | 6,394,800 |

As will be apparent from the results shown in Table 1, the dielectric film samples (Sample Nos. 2 through 13) containing ceramic particles including two crystalline phases of different axial ratios c/a arranged to define a core-shell structure, while having permittivity of greater than or equal to 3, has dielectric breakdown voltage of greater than or equal to 1440 V.

Moreover, a sample employing the ceramic particles of the type which includes a crystalline phase which differs in c/a from the core of the particle formed on part of the ceramic particle surface, while having a permittivity of 3.3, has a dielectric breakdown voltage of 1250 V.

Furthermore, a sample employing the ceramic particles of the type which includes two or more crystalline phases of different axial ratios c/a obtained by adhering two elements (MgO and $Y_2O_3$) to part of the surface of barium titanate powder, while having a permittivity of 3.1, has a dielectric breakdown voltage of 1320 V.

Among those samples, one including a core portion made of barium titanate and a shell portion with a solid solution of Mg (Sample Nos. 2 through 7) exhibited an electrostatic energy density ($\in \times E^2$) of greater than or equal to 7,879,680. These samples are higher in electrostatic energy density than a sample including a shell portion with a solid solution of one of Sr, Zr, and Sn (Sample Nos. 8 through 13).

By way of contrast, a sample employing the ceramic particles of the type which has a single axial ratio c/a (Sample No. 1), while having a permittivity of 3.3, has a dielectric breakdown voltage of 860 V.

REFERENCE SIGNS LIST

1, 11: Dielectric film
3, 13: Ceramic particle
3a: Core
3b: Shell
5: Organic resin
13a: Crystalline phase
21: Electrode layer
23: Main body
24: External electrode
25: Lead wire
26: Exterior member

The invention claimed is:
1. A dielectric film, comprising:
an organic resin; and
ceramic particles contained in the organic resin,
the ceramic particles each having a crystal lattice defined by three axes composed of axis a, axis b, and axis c, and including two or more crystalline phases of different axial ratios c/a, and an electrostatic energy density of the dielectric film being greater than or equal to 6220800.
2. The dielectric film according to claim 1,
wherein the ceramic particles each have the crystal lattice defined by the three axes composed of axis a, axis b, and axis c, and include only two crystalline phases of different axial ratios c/a.
3. The dielectric film according to claim 2,
wherein the ceramic particles each have a core-shell structure composed of a core portion and a shell portion positioned around the core portion, and the core portion is constituted by one of the two crystalline phases, and the shell portion is constituted by the other one of the two crystalline phases.
4. The dielectric film according to claim 3,
wherein the crystalline phase constituting the shell portion is smaller in axial ratio c/a than the crystalline phase constituting the core portion.
5. The dielectric film according to claim 4,
wherein the ceramic particles are a ceramic particle having a perovskite structure.
6. The dielectric film according to claim 3,
wherein the ceramic particles each contain magnesium, and the shell portion is higher in magnesium content concentration than the core portion.
7. A film capacitor, comprising:
the dielectric film according to claim 1; and
an electrode layer disposed on the dielectric film.
8. An electric device, comprising:
an electric circuit including a conductor; and
the film capacitor according to claim 7 connected to the conductor.
9. The dielectric film according to claim 4,
wherein a difference of axial ratios c/a between the crystalline phase constituting the shell portion and the crystalline phase constituting the core portion is 0.008 or more.

* * * * *